United States Patent
Parsa

(10) Patent No.: US 7,930,668 B1
(45) Date of Patent: Apr. 19, 2011

(54) PLACEMENT AND ROUTING USING INHIBITED OVERLAP OF EXPANDED AREAS

(75) Inventor: Mehrdad Parsa, Santa Cruz, CA (US)

(73) Assignee: Xilinx, Inc., San Jose, CA (US)

( * ) Notice: Subject to any disclaimer, the term of this patent is extended or adjusted under 35 U.S.C. 154(b) by 450 days.

(21) Appl. No.: 12/099,223

(22) Filed: Apr. 8, 2008

(51) Int. Cl.
G06F 17/50 (2006.01)
(52) U.S. Cl. ........ 716/126; 716/116; 716/119; 716/122; 716/128; 716/130; 703/19
(58) Field of Classification Search .............. 716/8–14, 716/16, 17, 108, 113, 116, 118, 119, 121, 716/122, 126, 128–130; 703/19
See application file for complete search history.

(56) References Cited

U.S. PATENT DOCUMENTS

| | | | | | |
|---|---|---|---|---|---|
| 6,099,583 | A | * | 8/2000 | Nag | 716/117 |
| 6,668,365 | B2 | * | 12/2003 | Harn | 716/10 |
| 7,111,268 | B1 | * | 9/2006 | Anderson et al. | 716/11 |
| 7,152,217 | B1 | * | 12/2006 | Srinivasan | 716/13 |
| 7,225,116 | B2 | * | 5/2007 | Harn | 703/14 |
| 2007/0079273 | A1 | * | 4/2007 | Lahner et al. | 716/10 |
| 2009/0187870 | A1 | * | 7/2009 | Yifrach et al. | 716/9 |

OTHER PUBLICATIONS

"Engineering Details of a Stable Force-Directed Placer", by Kristofer Vorwerk, Andrew Kennings, and Anthony Vannelli, pp. 573-580, IEEE @2004.*
Kleinhans, Jürgen M. et al.; "Gordian: VLSI Placement by Quadratic Programming and Slicing Optimization"; IEEE Transaction on Computer-Aided Design, vol. 10, No. 3; Mar. 1991; Copyright 1991 IEEE; pp. 356-365.
Eisenmann, Hans et al.; "Generic Global Placement and Floorplanning"; Copyright 1998 ACM; DAC 1998; pp. 269-274.
McMurchie, Larry et al.; "PathFinder: A Negotiation-Based Performance-Driven Router for FPGAs"; Proc. of the 1995 ACM Third International Symposium on Field-Programmable Gate Arrays Aided Design; Feb. 1995; pp. 111-117.
Betz, Vaughn et al.; "VPR: A New Packing, Placement and Routing Tool for FPGA Research"; 1997 International Workshop on Field Programmable Logic and Applications; pp. 1-10.
Marquardt, Alexander et al.; "Using Cluster-Based Logic Blocks and Timing-Driven Packing to Improve FPGA Speed and Density"; FPGA 1999; pp. 1-10.
Bozorgzadeh, E. et al.; "RPack: Routability-Driven Packing for Cluster-Based FPGAs"; Copyright 2001 IEEE; Asia South Pacific Design Automation Conference ASPDAC 01; pp. 629-634.
Dijkstra E. W.; "A Note on Two Problems in Connexion with Graphs"; Numerische Mathematik 1; 1959; pp. 269-271.

* cited by examiner

*Primary Examiner* — Paul Dinh
*Assistant Examiner* — Nha T Nguyen
(74) *Attorney, Agent, or Firm* — LeRoy D. Maunu

(57) ABSTRACT

Methods of placing and routing a logic design are provided. The logic design includes logic elements and nets connecting the logic elements. A first placement and a partial routing of the logic elements and the nets of the logic design are generated. The partial routing leaves some of the nets unsuccessfully routed. An initial area associated with each of the logic elements is expanded for the logic elements that are connected to the unsuccessfully routed nets. Positions for the logic elements are determined from a linear system that reduces a total length of the nets connecting the logic elements and inhibits overlap of the areas of the logic elements. A second placement of the logic elements is generated from the positions. A complete routing of all of the nets is generated for the second placement. A specification of the second placement and the complete routing is output.

19 Claims, 4 Drawing Sheets

PLACEMENT AND ROUTING USING INHIBITED OVERLAP OF EXPANDED AREAS

FIELD OF THE INVENTION

The present invention generally relates to placement and routing of logic designs, and more particularly to analytic approaches for placement and routing of logic designs.

BACKGROUND

The implementation of a logic design is traditionally divided into sub-problems including synthesizing a high-level description of the logic design into a list of nets connecting basic logic elements, placing the logic elements, and routing the nets between the placed logic elements.

Placement generally places connected logic elements close together to reduce implementation area and to increase the probability that routing can successfully complete the interconnections between the logic elements. In addition, placing connected logic elements close together generally improves implementation performance, because long interconnect paths have more capacitance and resistance, resulting in longer propagation delays.

Routing creates wiring for implementing the nets between the placed logic elements. Because placement attempts to place connected logic elements close together, routing will result in many nets with short wires. Short wiring is generally advantageous for routing. However, localized areas of dense wiring can prevent successfully routing some of the nets.

The present invention may address one or more of the above issues.

SUMMARY

Various embodiments of the invention provide methods of placing and routing a logic design. The logic design includes logic elements and nets connecting the logic elements. A first placement and a partial routing of the logic elements and the nets of the logic design is generated. The partial routing has a portion of the nets unsuccessfully routed. An area is associated with each of the logic elements. An initial area associated with each of the logic elements is expanded for the logic elements that are connected to the unsuccessfully routed nets. Positions for the logic elements are determined from a linear system that reduces a total length of the nets connecting the logic elements and inhibits overlap of the areas of the logic elements. A second placement of the logic elements is generated in response to the positions for the logic elements. A complete routing of all of the nets is generated that connects the second placement of the logic elements. A specification of the second placement and the complete routing is output.

It will be appreciated that various other embodiments are set forth in the Detailed Description and Claims that follow.

BRIEF DESCRIPTION OF THE DRAWINGS

Various aspects and advantages of the invention will become apparent upon review of the following detailed description and upon reference to the drawings, in which.

DETAILED DESCRIPTION OF THE DRAWINGS

The general objective of placement is to place connected logic elements in close physical proximity to one another. This improves utilization of chip area and increases the probability of successfully routing the interconnections between the logic elements. In addition, placing connected logic elements close together generally improves circuit performance by avoiding the delays of long interconnect paths.

After placement, the nets are routed through the interconnect resources, such as conductors and programmable switches. Each interconnect resource has a cost, which is determined based on a combination of physical properties, such as wire length and capacitance, or other factors such as demand by interconnections. The nets are assigned to interconnect resources to minimize the cost of the routing.

Frequently, placement and routing are timing-driven. Each net is assigned a weight, with the timing critical nets being assigned higher weights. During placement, the weighted total wire length of connections is minimized. During routing, the timing critical nets are assigned to lower-cost interconnect resources. This generally produces shorter wires for the timing critical nets and reduces path delays along the timing critical nets. However, dense placements can cause localized routing congestion that prevents the successful routing of nets through the congested area.

Various embodiments of the invention perturb the placement to achieve a routable logic design while allowing timing optimization. After an unsuccessful routing attempt for a placement, the placement is perturbed to enable successful routing of the modified placement. Feedback is provided from unsuccessfully routed nets to a new placement to make successful routing more likely. This routing feedback is provided within efficient linear programmable algorithms for placing the logic design. Feedback is also provided that identifies the nets that are timing critical to prioritize the routing of these nets. This timing feedback improves the timing characteristics of the resulting implementation of the logic design.

Certain embodiments of the invention also provide clustering of logic for cluster-based programmable integrated circuits while permitting placement perturbation for routing and timing optimization. Early clustering of logic elements reduces the complexity of placement and routing; however, early clustering also reduces flexibility and impacts the routability and timing for a logic design. Certain embodiments postpone clustering until after placement and routing to improve the implementation of the logic design. Clustering can be postponed because of the efficient linear programming algorithms for placing a logic design using routing feedback.

Figure 1:
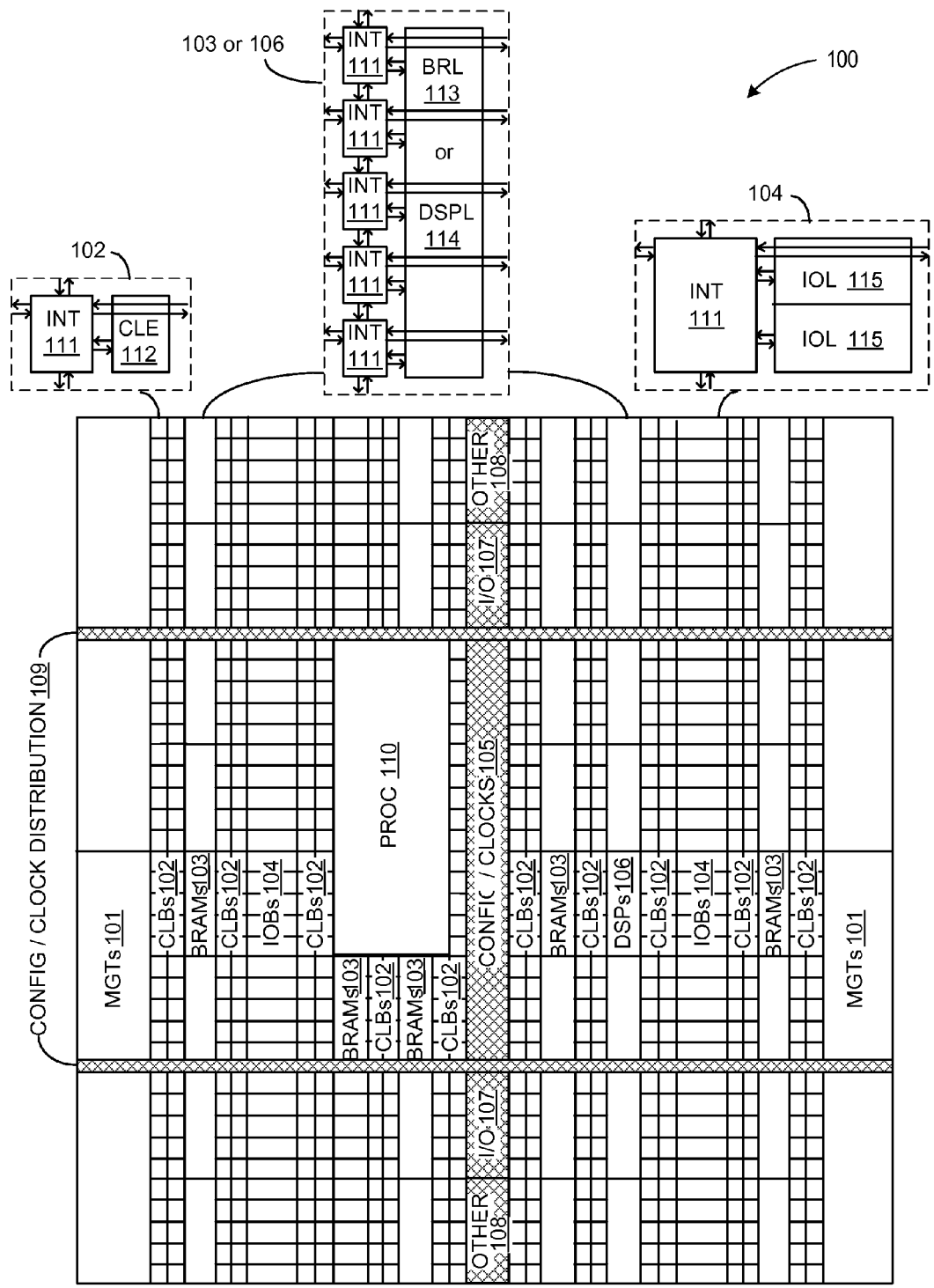
FIG. 1 is a block diagram of a programmable integrated circuit that implements a logic design in accordance with various embodiments of the invention.

FIG. 1 is a block diagram of a programmable integrated circuit that implements a logic design in accordance with various embodiments of the invention. A placement and routing is generated for implementing the logic design in the programmable integrated circuit.

Advanced programmable integrated circuits can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
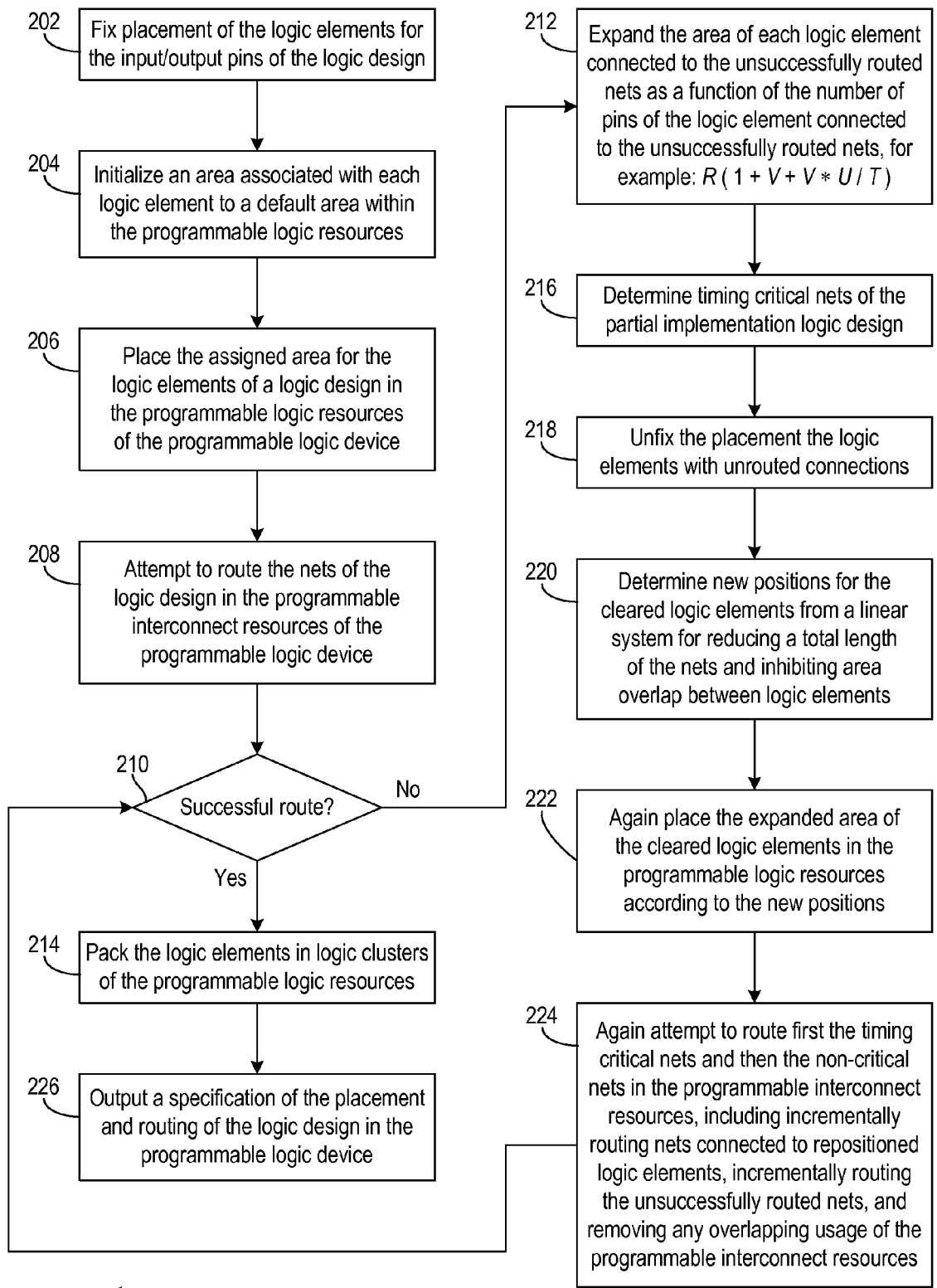
FIG. 2 is a flow diagram of a process for placing and routing a logic design in accordance with various embodiments of the invention.

FIG. 2 is a flow diagram of a process 200 for placing and routing a logic design in accordance with various embodiments of the invention. Process 200 generates a series of placements until routing is successful at the last placement in the series. Each unsuccessfully routed placement is modified to generate the next placement in the series by expanding areas for logic elements associated with the nets that are incompletely routed. The expanded areas create space in the placement for routing these nets. Thus, there is feedback between the incompletely routed nets and the placement of the logic elements that define the bounds of the incomplete routing.

At step 202, the placement is fixed for the logic elements corresponding to the input/output pins of the logic design. In one embodiment, the logic design is for an integrated circuit, such as a programmable integrated circuit, and the integrated circuit is mounted on a printed circuit board. The printed circuit board fixes the positions of the input/output pins on the integrated circuit.

At step 204, an area associated with each logic element is initialized to a default area within the programmable logic resources. In one embodiment, the area corresponds to a physical area for implementing the logic element in an integrated circuit. In another embodiment, the area corresponds to a unit of programmable logic resources for implementing the logic element in a programmable integrated circuit.

At step 206, the logic elements are placed in the programmable logic resources of the programmable integrated circuit using the associated areas. In one embodiment, physical areas of the logic elements are packed together to minimize the wire length of the nets connecting the logic elements.

At step 208, process 200 attempts to route the nets between the placed logic elements. In one embodiment, the nets are routed through the programmable interconnect resources of a programmable integrated circuit. Decision 210 checks whether the routing was successful. For unsuccessful routing, process 200 proceeds to step 212 to generate a modified placement for another routing attempt. For successful routing, process 200 proceeds to step 214 to complete an implementation of the logic design.

At step 212, the areas are expanded for logic elements associated with unsuccessfully routed nets. In one embodiment, the areas are expanded for logic elements having a pin connected to an unsuccessfully routed net. The area is expanded as a function of the number of pins of the logic element that are connected to unsuccessfully routed nets. For example, the areas of these logic elements are expanded by a factor proportional to $1+V+V*U/T$, with V being an allowable overlap limit, T being a number of the pins of the logic element, and U being a number of the pins that connect to the unsuccessfully routed nets.

At step 216, the nets are determined that are timing critical in the partial implementation of the logic design. In one embodiment, routing fails because the unsuccessfully routed nets overlap the usage of certain interconnect resources, such as routing tracks in an integrated circuit or programmable interconnect resources in a programmable integrated circuit. A timing analysis determines the critical timing paths of the partially routed design by ignoring the electrical shorts implied by overlapping usage of interconnect resources. The nets along the critical timing paths are the timing critical nets.

At step 218, the placement is modified by clearing or "unplacing" the logic elements that are connected by the unsuccessfully routed nets. In one embodiment, certain logic elements have a fixed placement, such as the logic elements for the input/output pins fixed at step 202. The modified placement generally does not clear the placement of fixed logic elements.

At step 220, new positions are determined for the cleared logic elements by solving a linear system for reducing a total length of the nets and for inhibiting area overlap between the logic elements. In one embodiment, a similar linear system at step 206 determines positions for the logic elements without fixed positions from step 202, and the linear system of step 220 determines new positions for these logic elements after the area expansion of step 212. Thus, each iteration of step 220 can produce modified positions for every unfixed logic element. However, each iteration of step 220 frequently produces matching positions for many of the unfixed logic elements because similar systems are solved at each iteration of step 220. Generally, each iteration "spreads out" the logic elements around each logic element connected to an unsuccessfully routed net. This creates space in the placement for routing these unsuccessfully routed nets.

At step 222, the cleared logic elements from step 218 are placed again. In one embodiment, a new placement is generated for all of the unfixed logic elements based on the positions from step 220. However, the new and preceding placements can be identical for certain logic elements. In another embodiment, the cleared logic elements are incrementally placed according to the new positions from step 220. Incremental placement can displace certain logic elements and these displaced logic elements are also incrementally placed according to the new positions from step 220. Thus, step 222 does not modify the placement of certain logic elements.

In another embodiment, to control and limit the number of incremental iterations, after successful placement and routing of a block that has an unroutable pin, the block could be locked (fixed) permanently.

At step 224, certain nets are routed again in the programmable interconnect resources. The nets are routed in an order provided from the timing analysis of step 216, with the timing critical nets routed before the other nets. In one embodiment, all of the nets are routed while ignoring the preceding routing attempt. In another embodiment, the unsuccessfully routed nets and the nets connected to repositioned logic elements are "ripped up" and incrementally routed.

In one embodiment, each net routed in step 222 is initially routed without regard to any existing usage of the programmable interconnect resources by other nets. This can lead to overlapping usage of certain programmable interconnect resources by multiple nets. Step 224 includes an overlap removal phase that increases the cost of the programmable interconnect resources used by multiple nets and attempts to incrementally reroute these nets based on the increased costs. If overlap removal is unsuccessful, then process 200 returns to decision 210 for another iteration of area expansion followed by placement and routing.

At step 214, for a successful placement and routing, the logic elements are packed into logic clusters based on the final placement. In one embodiment, a grid for the logic clusters is superimposed on the placement and each logic element within a square of the grid is assigned to the cluster corresponding to the square. At step 226, a specification is output of the successful placement and routing of the logic design in the programmable integrated circuit.

Figure 3:
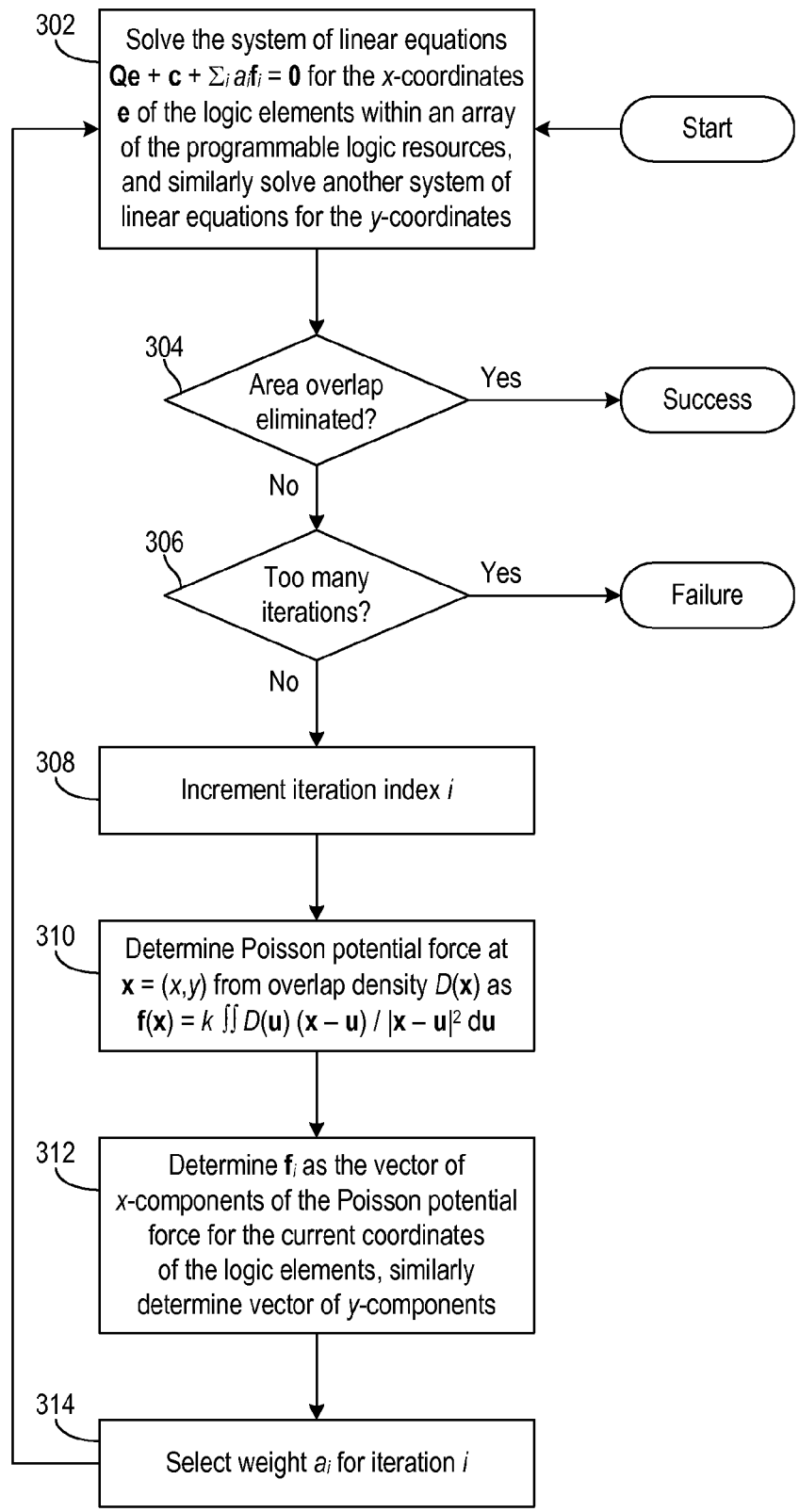
FIG. 3 is a flow diagram for placing logic elements of a logic design in accordance with various embodiments of the invention.

FIG. 3 is a flow diagram for placing logic elements of a logic design in accordance with various embodiments of the invention. In one embodiment, FIG. 3 corresponds to step 220 of FIG. 2.

After anchoring certain logic elements (see step 202 of FIG. 2) placement of the logic elements is determined from the minimization problem:

$$\min \sum_c w_c L(c),$$

where c is an index of the connections and $w_c$ is a weight of connection c. L(c) represents the length of the connection c.

In one embodiment, the length of a connection is based on its squared Euclidean distance. An advantage of this approach is that the resulting quadratic optimization can be solved efficiently using a conjugate gradient. The above minimization can be expressed as a quadratic optimization problem. For the x-axis, this problem is the minimization problem:

$$\min \sum_{i,j} w_{ij}(x_i - x_j)^2 = \min \frac{1}{2} e^T Q e + c^T e + d.$$

This minimization problem is solved for the x-coordinate $x_i$ of each logic element having index i, and these x-coordinates for all logic elements are collectively represented by vector e. There is an analogously defined minimization problem for the y-coordinates of the logic elements. Weights $w_{ij}$ represents the weight of the nets connecting the logic elements with indices i and j. The matrix Q is the Hessian, which represents the available wire connectivity between the circuit elements. The Hessian is a symmetric positive-definite matrix because some logic elements, such as the primary inputs and the primary outputs, are fixed. The vector c corresponds to the connections between the fixed and movable logic elements, and the vector d corresponds to the connections between fixed elements.

This optimization problem is convex and has a unique minimum given for the x-axis by the solution to the system of linear equations:

$$Qe + c = 0.$$

There are efficient methods, such as the conjugate gradient, to solve such a system of equations for the coordinates e.

However, this formulation does not have constraints to prevent logic elements from overlapping with each other. The resulting solution does provide relative locations for possibly overlapping logic elements. Additional constraints can provide spreading forces to eliminate overlap between the logic elements. The spreading forces perturb the placement to remove overlaps by pushing logic elements away from areas of high overlap density.

At an iteration i, the positions along the x-axis of the elements are determined by solving the linear system of equations:

$$Qe + c + \sum_{j=1}^{i-1} a_j f_j + a_i f_i = 0,$$

where $f_i$ represents the spreading forces calculated with weight $a_i$ for iteration i. The term $a_i f_i$ represents the weighted spreading forces calculated for the current iteration and the summation term accumulates the weighted spreading forces from prior iterations to prevent reversal of the spreading accomplished in the prior iterations.

At step 302, the above linear system of equations is solved for the x-coordinates e of the logic elements and a similar linear system is solved for the y-coordinates. Decision 304 checks whether overlap is eliminated sufficiently. When overlap between logic elements becomes relatively small, the placement completes with a fitting step that places the logic elements onto a physical place grid for the programmable logic resources based on the real-valued solution for the coordinates of the logic elements.

Decision 306 aborts the placement process when an iteration limit is reached. At step 308, an iteration index is incremented.

At step 310, a force potential is calculation at location x=(x, y) using Poisson's equation:

$$f(x) = k \int \int D(u) \frac{x-u}{|x-u|^2} du,$$

where f(x) is the force on a logic element at location x and D(x) represents the overlap density that is the ratio of the total to the allowed occupancy at point x of the programmable interconnect resources.

At step 312, Poisson's equation is evaluated at the current coordinates of each logic element to determine the vector of spreading forces $f_i$ along the x-axis. Another vector of spreading forces along the y-axis is similarly calculated for the logic elements.

At step 314, a weight is selected for the spreading forces. In one embodiment, the weight is based on the magnitude of residual overlap between the logic elements. The process then returns to step 302, where another system of linear equations using the new values is solved.

Figure 4:
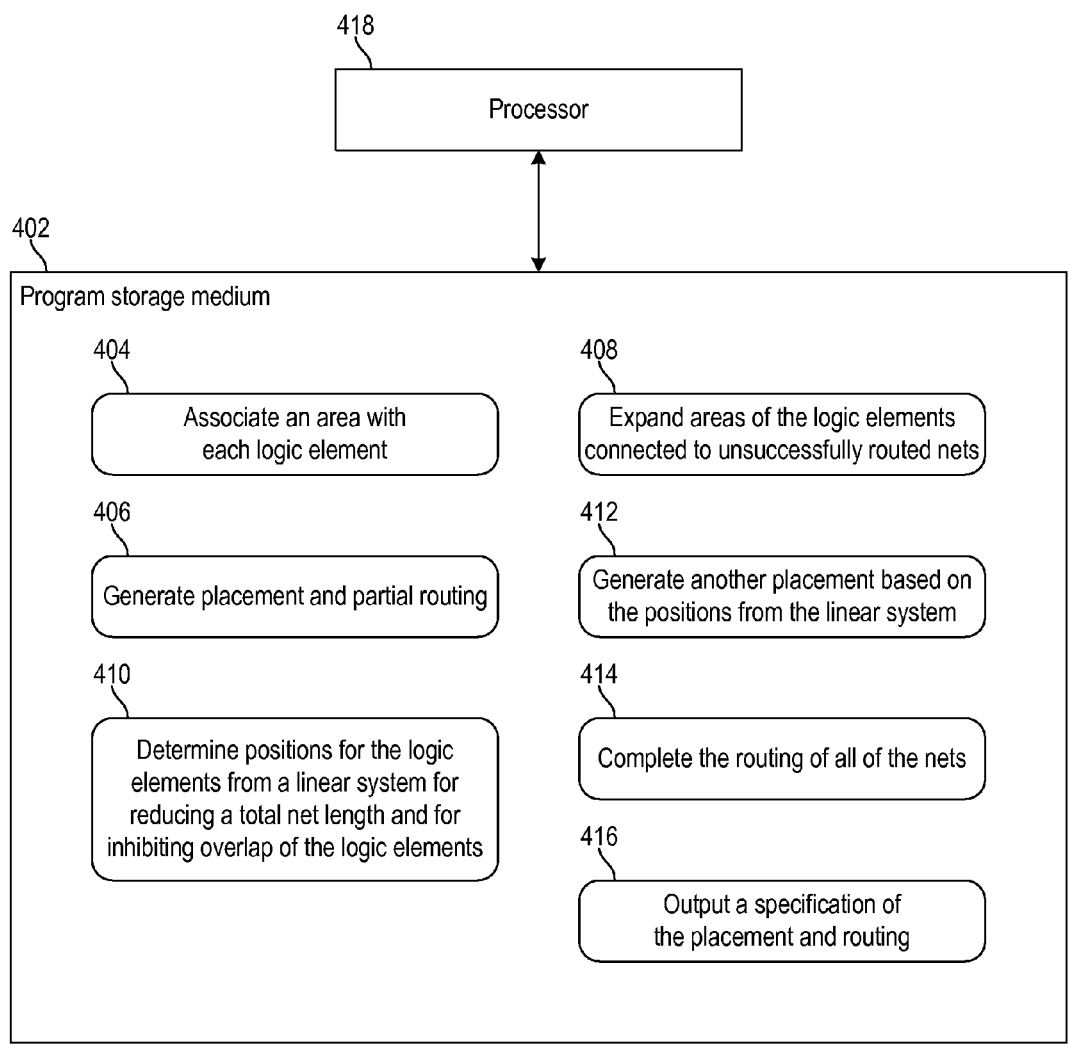
FIG. 4 is a block diagram of a system for placing and routing a logic design in accordance with one or more embodiments of the invention.

FIG. 4 is a block diagram of a system for placing and routing a logic design in accordance with one or more embodiments of the invention. A program storage medium 402 is configured with software modules 404 through 416. In one embodiment, the system provides a means for placing and routing a logic design.

Execution of the instructions in software module 404 causes processor 418 to associate an initial area with each of the logic elements. Execution of the instructions in software module 406 causes processor 418 to generate a placement and a partial routing of the logic design in programmable logic and interconnect resources. The routing is unsuccessful, because a portion of the nets are unsuccessfully routed.

Execution of the instructions in software module 408 causes processor 418 to expand the areas of the logic elements that are connected by the nets that are unsuccessfully routed. Execution of the instructions of software module 410 causes processor 418 to determine positions for the logic elements from a linear system for reducing a total length of the nets connecting the logic elements and for inhibiting overlap of the areas of the logic elements.

Execution of the instructions of software module 412 causes processor 418 to generate another placement of the logic elements in the programmable logic resources as a function of the determined positions for the logic elements. Execution of the instructions of software module 414 causes processor 418 to complete the routing of all of the nets in the programmable interconnect resources. Execution of the instructions of software module 416 causes processor 418 to output a specification of the placement and the complete routing.

Those skilled in the art will appreciate that various alternative computing arrangements, including one or more processors and a memory arrangement configured with program code, would be suitable for hosting the processes and data structures of the different embodiments of the present invention. In addition, the processes may be provided via a variety of computer-readable storage media or delivery channels such as magnetic or optical disks or tapes, electronic storage devices, or as application services over a network.

The present invention is thought to be applicable to a variety of systems for placing and routing circuit designs. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A processor-implemented method of placing and routing a logic design, the logic design including a plurality of logic elements and a plurality of nets connecting the logic elements, the processor-implemented method comprising:
on one or more programmed processors, performing operations including:
generating a first placement and a partial routing of the logic elements and the nets of the logic design, leaving a portion of the nets unsuccessfully routed;
associating an area with each of the logic elements, including associating an initial area with each of the logic elements and expanding into expanded areas, the initial areas of the logic elements that are connected by the nets that are unsuccessfully routed;
wherein the expanding includes expanding the initial area of the logic element having a plurality of pins to a size that is a function of a number of the pins which are connected to the nets that are unsuccessfully routed;
unplacing the logic elements that are connected by the unsuccessfully routed nets;
from a linear system, determining positions for the unplaced logic elements that reduce a total length of the nets connecting the unplaced logic elements and inhibit overlap of the expanded areas of the unplaced logic elements;
generating a second placement of the logic elements in response to the positions for the unplaced logic elements; and
generating a complete routing of all of the nets for connecting the second placement of the logic elements; and
outputting a specification of the second placement and the complete routing.

2. The processor-implemented method of claim 1, wherein the expanding includes expanding the initial area of each logic element by a factor proportional to 1+V+V*U/T, with V being an allowable overlap limit, T being a number of a plurality of pins of the logic element, and U being a number of the pins which are connected to the nets that are unsuccessfully routed.

3. The processor-implemented method of claim 1, further comprising fixing each placement of the logic elements for a plurality of input/output pins of the logic design.

4. The processor-implemented method of claim 1, wherein:
the determining includes solving a sequence of linear programming problems; and
each linear programming problem in the sequence minimizes a sum of the total length of the nets and an accumulation, the accumulation for each linear programming problem being a sum of respective terms for the linear programming problem and for the linear programming problems preceding the linear programming problem in the sequence, each respective term being a weighting of spreading forces from a potential of a density of the overlap.

5. The processor-implemented method of claim 1, wherein generating the second placement of the logic elements includes clearing the first placement of the logic elements that are connected by the nets that are unsuccessfully routed in the partial routing.

6. The processor-implemented method of claim 1, wherein generating the complete routing of all of the nets includes incrementally routing the nets that are unsuccessfully routed in the partial routing.

7. The processor-implemented method of claim 1, wherein generating the complete routing of all of the nets includes incrementally routing the nets connected to those of the logic elements that are repositioned between the first and second placements.

8. The processor-implemented method of claim 1, further comprising determining the nets that are timing critical, wherein generating the complete routing of all of the nets includes generating a complete routing of the nets that are timing critical before generating a complete routing of the nets that are not timing critical.

9. The processor-implemented method of claim 1, wherein generating the first placement and the partial routing of the logic elements includes:
   from the linear system, determining initial positions for the logic elements that reduce a total length of the nets connecting the logic elements and inhibit overlap of the initial areas of the logic elements;
   generating the first placement of the logic elements in a plurality of programmable logic resources in response to the initial positions for the logic elements; and
   generating the partial routing of the nets in a plurality of programmable interconnect resources for connecting the first placement of the logic elements, including unsuccessfully attempting a routing of all of the nets in the programmable interconnect resources for connecting the first placement of the logic elements, wherein the portion of the nets are unsuccessfully routed.

10. The processor-implemented method of claim 1, wherein generating the first placement and the partial routing includes:
   placing the logic elements in a plurality of programmable logic resources of a programmable integrated circuit; and
   attempting a routing of the nets in a plurality of programmable interconnect resources of the programmable integrated circuit for connecting the logic elements placed in the programmable logic resources.

11. The processor-implemented method of claim 1, wherein determining the positions for the logic elements includes solving the linear system that is a linear programming problem for providing coordinates for each of the logic elements within an array of programmable logic resources in a programmable integrated circuit.

12. The processor-implemented method of claim 1, wherein determining the positions for the logic elements includes solving a sequence of linear equations $$Qe + c + \sum_i a_i f_i = 0$$

for a coordinate e of the logic elements within an array of programmable logic resources in a programmable integrated circuit, with Q being a connectivity matrix of a plurality of programmable interconnect resources in the programmable integrated circuit, C being a cost between fixed and movable ones of the logic elements, i being an iteration index of the linear equations in the sequence, and $a_i$ being a scalar weight for iteration index i of spreading forces $f_i$ from a Poisson potential of a density of an overlap for iteration index i of the areas of the logic elements.

13. The processor-implemented method of claim 1, wherein generating the complete routing of all of the nets includes removing overlapping usage by the nets of a plurality of programmable interconnect resources.

14. The processor-implemented method of claim 1, further comprising:
   iteratively attempting a routing of the nets in a plurality of programmable interconnect resources for connecting the logic elements placed in a plurality of programmable logic resources;
   in response to the attempting being unsuccessful and consequently generating a partial routing, repeating the expanding of the areas of the logic elements that are connected to the nets that are unsuccessfully routed in the partial routing and repeating the determining of the positions for the logic elements that inhibit overlap of the expanding of the areas of the logic elements and repeating the generating of the second placement in response to the positions and
   in response to the attempting being successful, generating the complete routing.

15. The processor-implemented method of claim 1, wherein:
   the first placement and the second placement place the logic elements in a plurality of programmable logic resources that include a plurality of logic clusters;
   each logic cluster includes a plurality of lookup tables, a plurality of registers, and at least one carry chain; and
   the logic elements include the lookup tables, the registers, and the carry chains of the logic clusters.

16. The processor-implemented method of claim 1, further comprising packing the logic elements according to the second placement into a plurality of logic clusters of a plurality of programmable logic resources of a programmable integrated circuit.

17. An article of manufacture, comprising:
   a non-transitory processor-readable program storage medium configured with instructions for placing and routing a logic design in programmable logic resources and programmable interconnect resources of a programmable integrated circuit, the logic design including a plurality of logic elements and a plurality of nets connecting the logic elements, wherein execution of the instructions by one or more processors causes the one or more processors to perform operations including,
      generating a first placement and a partial routing of the logic elements and the nets of the logic design in the programmable logic and interconnect resources of the programmable integrated circuit, leaving a portion of the nets unsuccessfully routed;
      associating an area with each of the logic elements, including associating an initial area with each of the logic elements and expanding into expanded areas, the initial areas of the logic elements that are connected by the nets that are unsuccessfully routed;
      wherein the expanding includes expanding the initial area of the logic element having a plurality of pins to a size that is a function of a number of the pins which are connected to the nets that are unsuccessfully routed;
      unplacing the logic elements that are connected by the unsuccessfully routed nets;
      from a linear system, determining positions for the unplaced logic elements that reduce a total length of the nets connecting the unplaced logic elements and inhibit overlap of the expanded areas of the unplaced logic elements;

generating a second placement of the logic elements in the programmable logic resources in response to the positions for the unplaced logic elements;

generating a complete routing of all of the nets in the programmable interconnect resources for connecting the second placement of the logic elements; and outputting a specification of the second placement and the complete routing.

18. The article of manufacture of claim 17, wherein the operations further include determining the nets that are timing critical, wherein the operation of generating the complete routing of all of the nets includes generating the complete routing of the nets that are timing critical before generating the complete routing of the nets that are not timing critical.

19. A system for placing and routing a logic design in programmable logic and interconnect resources, the logic design including a plurality of logic elements and a plurality of nets connecting the logic elements, the system comprising:

one or more processors;

a memory arrangement coupled to the one or more processors and configured with instructions that when executed cause the one or more processors to perform operations including:

generating a first placement and a partial routing of the logic elements and the nets of the logic design in the programmable logic and interconnect resources, leaving a portion of the nets unsuccessfully routed;

associating an area with each of the logic elements, including expanding into expanded areas, the areas of the logic elements that are connected by the nets that are unsuccessfully routed;

wherein the expanding includes expanding the initial area of the logic element having a plurality of pins to a size that is a function of a number of the pins which are connected to the nets that are unsuccessfully routed;

unplacing the logic elements that are connected by the unsuccessfully routed nets;

determining from a linear system, positions for the unplaced logic elements that reduce a total length of the nets connecting the logic elements and inhibit overlap of the expanded areas of the unplaced logic elements;

generating a second placement of the logic elements in the programmable logic resources in response to the positions for the unplaced logic elements;

generating a complete routing of all of the nets in the programmable interconnect resources for connecting the second placement of the logic elements; and outputting a specification of the second placement and the complete routing.

* * * * *